United States Patent [19]

Hunter

[11] 4,356,623

[45] Nov. 2, 1982

[54] FABRICATION OF SUBMICRON SEMICONDUCTOR DEVICES

[75] Inventor: William R. Hunter, Garland, Tex.

[73] Assignee: Texas Instruments Incorporated, Dallas, Tex.

[21] Appl. No.: 187,642

[22] Filed: Sep. 15, 1980

[51] Int. Cl.³ .................... H01L 21/22; H01L 21/26
[52] U.S. Cl. ............................ 29/571; 29/576 B; 148/1.5; 148/187; 148/188
[58] Field of Search ............... 29/571, 576 B; 148/1.5, 148/187, 188

[56] References Cited

U.S. PATENT DOCUMENTS

| | | | |
|---|---|---|---|
| 3,997,367 | 12/1976 | Yau | 148/1.5 |
| 4,109,371 | 8/1978 | Shibata | 29/571 |
| 4,160,683 | 7/1979 | Roche | 148/187 |
| 4,198,250 | 4/1980 | Jecmen | 148/1.5 |
| 4,204,894 | 5/1980 | Komeda et al. | 148/188 |
| 4,209,349 | 6/1980 | Ho et al. | 148/187 |

*Primary Examiner*—G. Ozaki
*Attorney, Agent, or Firm*—Thomas E. Tyson; Richard L. Donaldson; Melvin Sharp

[57] ABSTRACT

A method for fabricating a semiconductor device of relatively small scale. A conductivity layer is deposited on a substrate of a polarity. Regions of opposite polarity are partially formed on either side of the conductor layer. Vertical layers are formed to partially cover the regions of opposite polarity and are located adjacent to the conductor layer. Extensions of the regions of opposite polarity are formed such that a portion of the extension is defined by the location of the vertical layers.

25 Claims, 17 Drawing Figures

FABRICATION OF SUBMICRON SEMICONDUCTOR DEVICES

BACKGROUND

This invention relates to semiconductor devices and methods in manufacture and more particularly to semiconductor devices having a gate length of approximately one micron or less.

Semiconductor devices are widely used throughout the electronics industry, and the applications of semiconductor devices has dramatically increased in other areas such as games, automotive applications, industrial controls, consumer products, etc. A major reason for this increased use of semiconductor devices can be attributed to the dramatic reduction in production costs achieved by the electronics industry. For example, in the computer industry where there has been a demand for more and more storage capacity in computer memory, low cost, high density memories have been produced. In the past ten years, semiconductor memories have been developed where the number of bits of storage per semiconductor chip has been increased from 16 to 64 K. The cost per bit has been reduced by a factor of approximately 200. By increasing the density of semiconductor elements on a single chip, the manufacturing costs can be dramatically decreased. The production cost of a semiconductor memory lies particularly in the bonding, packaging, testing, and handling operations, rather than in the cost of the silicon chip which contains the actual circuitry. Therefore, any circuit which can be contained within a given chip size, for example, 300,000 square mils, will cost about the same as any other. By forming large numbers of memory cells in a single chip, the cost per bit be greatly reduced.

Since a tremendous cost reduction can be achieved by increasing the density of semiconductor device formed on a single chip, the electronic industry has focused a great deal of effort toward the design and manufacture of integrated circuits, characterized by extremely complex circuitry. Such circuits are commonly referred to as Very Large Scale Integration (VLSI) circuits. This effort of the electronics industry has resulted in the increase of dynamic random access memory storage capacity from 4 K bits per chip to 64 K bits per chip with the 64 K bit chip about the same size as the 4 K bit per chip.

The conventional approach to increasing density upon a semiconductor chip is to reduce the size of the individual semiconductor device and place more of these devices upon a single chip. Commensurate with a scaling of horizontal dimensions, the vertical thickness of the gate insulation layer, source and drain are scaled down, while substrate doping is increased. However, as device dimensions have become smaller to accommodate the higher packing density, several problems have arisen. Such problems result from the existing electrical field properties of the semiconductor devices. These include parasitic capacitances and resistances and punchthrough currents. A paper entitled "Design of Ion-Implanted MOSFETs with Very Small Physical Dimensions" by R. H. Dennard et al., IEEE Journal of Solid State Circuits, Vol. SC-9, pp 256-268, October 1974, discusses the design, fabrication and characterization of very small MOSFET devices of one micron. Scaling relationships are presented that show how this reduction is accomplished. Techniques such as high resolution optical lithography, electron beam pattern writing and X-ray lithography are suggested in forming integrated circuit patterns. Undesirable changes in the device characteristics occur when source to drain spacing is reduced. These changes become significant when depletion regions, surrounding the source and drain, extend over the silicon substrate region under the gate and merge. This paper suggests that those short-channel effects can be avoided by scaling down the vertical dimensions of the FET such as gate insulator thickness and junction depth along with reducing the horizontal dimensions while also proportionately decreasing the applied voltages and increasing the substrate doping concentration. Specifically the doping profile of the channel region is increased to control these short-channel effects in MOSFET switching devices.

The other problem in scaling down the dimensions of the semiconductor device is parasitic current conduction. Parasitic current condition is affected by the depletion layers that surround the source and the drain region in the substrate. These depletion layers are directly affected by the voltage on the device and also by the doping of the substrate. If these depletion layers merge or overlap, then a condition called "punchthrough" can exist. Punchthrough is a phenomenon where a current between the source and the drain is present in such a manner that it is not controlled by the gate. A paper entitled, "Short Channel MOSFET's in the Punchthrough Current Mode" by John J. Barnes et al., IEEE Transactions on Electron Devices, Vol. ED-26, No. 4, April 1979, specifically addresses this punchthrough phenomenon. This paper discusses mathematical models that are used to predict punchthrough and further details the results of the experimentations that support the validity of these mathematical models. Techniques for preventing punchthrough were also discussed. These techniques include increasing the range of the doping profile, increasing the substrate concentration and/or double ion implantation in the channel. All of these techniques have certain adverse affects, for example, the increase of substrate sensitivity of threshold voltage, the increase of junction capacitance, source-and-drain line resistance, and the requirement of additional processing steps. Another paper entitled, "VLSI Limitations from Drain-Induced Barrier Lowering" by Ronald L. Troutman in IEEE Transactions on Electron Devices, Vol. ED-26, No. 4, April 1979, discusses punchthrough as an electrical limitation to scaling. This paper states that punchthrough is more likely to occur in semiconductor devices when the source or drain diffusions are deep, the substrate resistivity is high or the spacing between the source and the drain diffusions is minimal. The distance between the source and the drain diffusions is the channel length. However, as the physical channel length is reduced, the electrical length of a channel can be effectively increased by increasing the boundaries between these source and drain depletion layers which in turn can be accomplished by ion implantation in the channel or the use of low doped source and drain diffusions or recessing the channel into the substrate. Such solutions were proposed by F. Gaensslen in IBM Journal of Research and Development, Vol. 23, No. 6, pp 682-668, November 1979. Double ion implantation was also suggested as a solution to increasing a threshold voltage characteristic of a semiconductor device in a paper entitled, "Double Bond Implant Short-channel MOSFET" by Paul P. Wang, in IEEE Transactions on Electron Devices, Vol ED-24, No. 3, March 1977. The specific solution suggested was a shallow ion implant in the channel region between the source and the drain areas followed by a deeper implant which would be used to reduce the susceptibility of the device to punchthrough. This technique may be used with the disclosed invention to improve the threshold characteristics and reduce the susceptibility of the device to punchthrough. However, the double ion implant of the channel region would have to be performed prior to the formation of the gate.

Ideally the solution to both punchthrough and parasitic capacitance would be to fabricate a region of source and drain diffusion that is very shallow and also has low resistance. However, as the diffusion regions become shallow, the sheet resistance of these regions becomes increasingly large. In addition, reliable metallurgical contact to shallow source and drain regions is difficult. A solution would be to implant a shallow region of the source and drain adjacent to the gate and to use lithographically defined masking in the region near and including the gate to implant a deeper souce and drain region into regions more distant from the gate. This would result in low sheet resistance and ease of making metallurgical contact in regions distant from the gate. The limitation of lithographically defined masking patterns to accomplish this doubly-implanted shallow/-deep source and drain are two fold. Firstly, the necessity to allow for alignment tolerances will place a limitation on the minimum distance which two gates can be placed, if, for example, a contact hole to the diffused region between them must be made. Secondly, the minimum depth of the shallow junction region next to the gate will be determined by the acceptable sheet resistance of this shallow region. Furthermore, the magnitude of this sheet resistance will be variable (again due to alignment tolerances), which implies that gain reduction of the device to this sheet resistance will also be variable, complicating the ability to do circuit design.

What is required is a device that would have a self-aligning structure. One possible solution, employing subtractive etching, was suggested in a paper entitled, "A Quadruply Self-Aligned MOS (QSA MOS) a Short Channel High Speed High Density MOSFET for VLSI" by Kuniichi Ohta, et al. appearing in the Technical Digest, pp. 581-584, IEDM, December 1979. The technique suggested comprises the formation of a silicon nitride mask over the gate structure, followed by undercutting of the polysilicon gate using subtractive etching beneath this nitride layer. The substrate is masked from the deep ion implant by the silicon nitride pattern. The resulting heavier concentration is therefore offset from the polysilicon edge by the undercut distance. After removing the silicon nitride mask, a second shallow implant, self-aligned to the silicon gate pattern is performed. The result is a shallow ion implantation around the gate region, and a deeper ion implantation self-aligned but offset to the gate-edge. It can be appreciated by those skilled in the art that control of the gate length requires a high degree control of the undercut etch process used to accomplish this scheme.

SUMMARY OF THE INVENTION

In accordance with the present invention, a method for fabricating a semiconductor device is provided wherein a conductor layer is formed on the surface of a semiconductor substrate of one polarity between areas where regions of opposite polarity are to be formed in said substrate, the regions of opposite polarity are then partially formed, vertical layers are then formed adjacent to the conductor layer, and the extensions of regions of opposite polarity are then formed such that they are partly defined by the said vertical layers.

One aspect of this invention is embodied in a method for producing a semiconductor device comprising the steps of forming a conductor layer on the surface of a semiconductor substrate of one polarity between areas where regions of opposite polarity from the said substrate are to be formed, then forming the first vertical layers which are located adjacent to the conductor layer, then partially forming the regions of opposite polarity, then forming second vertical layers adjacent to the first vertical layers, and finally forming the extensions of the regions of opposite polarity partially defined by the first and second vertical layers.

Another aspect of this invention is embodied in a method for fabricating a field effect device comprising the steps of forming a gate on a substrate between the areas where the source and drain regions are to be formed, in partially forming the source and drain regions, then forming vertical layers adjacent to the gate, and forming extensions to the source and drain regions which are partially defined by the vertical layers. A further aspect of this invention is embodied in a method for fabricating a field effect device comprising the steps of forming a gate on the substrate between the areas where the source and drain regions are to be formed, forming the first vertical layers adjacent to the gate, partially forming the source and drain regions, forming second vertical layers adjacent to the first vertical layers, and forming extensions to the source and drain regions which are partly defined by the first and second vertical layers.

An additional aspect of this invention is embodied in a method for fabricating a field effect device comprising the steps of forming a gate on the substrate between the source and drain regions to be formed, and partially forming the source and drain regions by ion implantation, depositing a conformal layer on top of the gate, anisotropically etching the conformal layer, and forming extensions to the source and drain via a second ion implantation.

An even further aspect of this invention is embodied in a method for fabricating a field effect transistor comprising the steps of forming a gate on the substrate to define areas where the source and the drain regions are to be formed, depositing a conformal layer on top of the gate and remaining part of a first conformal layer, anisotropically etching the second conformal layer and forming extensions to the source and drain regions by a second ion implantation.

In one example of the invention, the semiconductor device is fabricated having a substrate with an insulating layer formed on its surface and a conductor layer formed above the insulating layer. The conductor length is about one micron or less, formed by anisotropic etching. Two regions of opposite polarity are formed in the substrate such that the conductor layer separates these regions. The regions of opposite polarity are formed by shallow doping. A conformal insulating layer of material such as silicon dioxide is then deposited on top of the substrate. This conformal layer is then anisotropically etched to form vertical layers adjacent to the sides of conductor layer and partially covering the regions of opposite polarity. A second doping is performed in the substrate, forming a heavier doping concentration in the regions of opposite polarity and extending these regions of opposite polarity deeper into the substrate forming a profile for these regions that consist of a shallow, lightly concentrated area immediately adjacent to the conductor layer under the vertical layers and contiguous with a deeper and more heavily doped region located farther from the gate. A formation of the vertical layers can be repeated by deposition of the conformal layer followed by anisotropic etching to allow the formation of an even deeper and more concentrated region of opposite polarity farther from the conductor layer than the first two regions that were formed.

It should be understood by those skilled in the art that a doping operation after each vertical layer formation is not necessary, provided that the lateral doping penetration of a subsequent repetition is less than the accumulated width of all previous vertical layers.

In another example of the invention, a method for manufacturing a semiconductor device is provided wherein a conductor layer is formed over an insulating layer on top of a substrate. A conformal layer is then deposited on top of the substrate and the conductor layer. This conformal layer is then anisotropically etched to form vertical layers beside the conductor and over the substrate. Doping is then performed to form two shallow regions of opposite polarity in the substrate adjacent to these vertical layers. A conformal layer is then deposited upon the substrate surface and over the conductor layer and to previously deposited vertical layers. The second conformal layer is then anisotropically etched to form a second set of vertical layers adjacent to the first set of vertical layers and partially covering the shallow regions of opposite polarity formed in the substrate. Doping is then performed on the substrate to form a concentrated and deeper extension to the regions of opposite polarity forming a profile of these regions of opposite polarity consisting of a shallow region partially underneath the first set of vertical sidewalls extending into a deeper and more concentrated region beginning underneath the outward extremity of the second vertical layers formed. This method of semiconductor fabrication would be particularly useful in the fabrication of charge coupled devices and metal-oxide-semiconductor field effect devices.

BRIEF DESCRIPTION OF THE DRAWINGS

The novel features believed characteristic of this invention are set forth in the appended claims; however, this invention can be best understood by referencing the following detailed description of the embodiment together with these drawings.

DETAILED DESCRIPTION OF THE INVENTION

Figure 1:
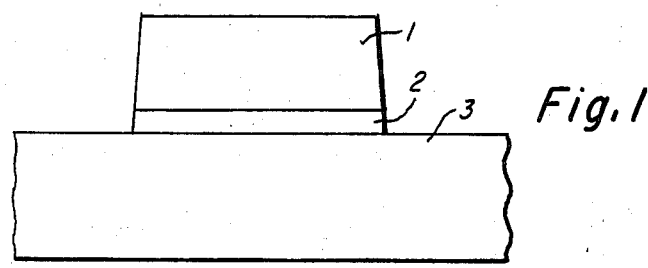
FIG. 1 is an enlarged sectional view illustrating the conductor layer and insulating layer on top of the substrate.

Referring to FIG. 1, a conductor 1 has been deposited on top of a insulating layer 2 which is on top of a substrate 3. An embodiment of this invention includes that this substrate 3 be P-type and lightly doped, in the range $1 \times 10^{15}$ to $1 \times 10^{16}$ dopant atoms per cubic centimeter. It should be understood by those skilled in the art that the substrate could be N-type as well. Layer 2 is a silicon dioxide layer in the range 400 angstroms to 75 angstroms in thickness. The conductor layer is deposited on top of the silicon dioxide layer. The conductor layer thickness is in the range of 3000 angstroms to 2000 angstroms and in the preferred embodiment, consist of degenerately doped polysilicon. It should be appreciated by those skilled in the art that this conductor layer could instead be a metallic conductor, constituting of, e.g., W, Mo, Ta and/or Ti, or that this conductor layer could also be a silicide, consisting of $WSi_2$, $MoSi_2$, $TaSi_2$, $PtSi$, $PdSi$, or that this conductor layer could also be a layered structure consisting of a silicide on top of degenerately doped polysilicon. The length of this conductor layer is in the range of about one micron to 0.1 micron. The formation of conductor layers less than one micron is discussed in U.S. patent application entitled "Formation of Submicron Substrate Element," inventor, William Hunter, et al., patent application Ser. No. 175,470.

Figure 2:
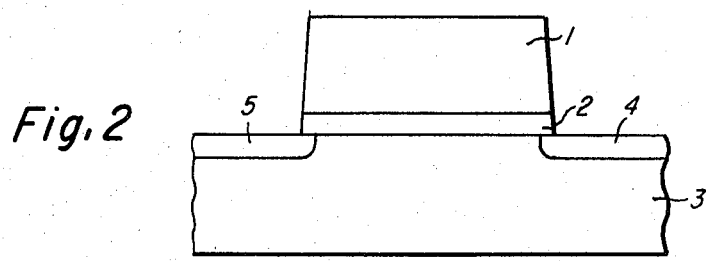
FIG. 2 is an enlarged sectional view illustrating the regions of opposite polarity formed in the substrate.

FIG. 2 illustrates the partial formation of the regions of opposite polarity in the substrate. The conductor layer 1 over the insulating layer 2 separates the two regions of opposite polarity 4 and 5 that have been formed in substrate 3. These regions are formed by ion implantation. In performing the ion implantation and subsequent drive-in anneal, these areas actually extend underneath the conductor layer and the insulating layer. It should be obvious to one skilled in the art that the partial formation of the regions of opposite polarity can also be accomplished by diffusion.

Figure 3:
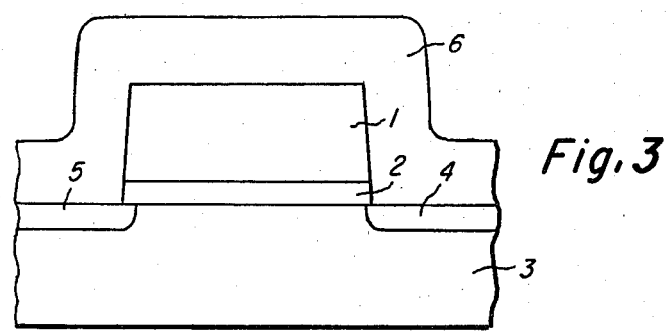
FIG. 3 is an enlarged sectional view illustrating the deposition of the conformal layer on the substrate and gate.

FIG. 3 illustrates the deposition of a conformal layer 6 on top of the conductor layer 1 insulating layer 2 and substrate 3, including the regions of opposite polarity 4 and 5. This conformal layer is deposited by deposition of a plasma enhanced chemical vapor deposition of silicon dioxide on the substrate at the temperature of 300 degrees C. to a depth comparable to the thickness of the conducting layer 1 and followed by a densification at 700 degrees C. for thirty minutes in steam. It should be understood by those skilled in the art that other sufficiently conformal deposition methods for layer 6 could be employed including the use of other materials such as silicon nitride.

Figure 4:
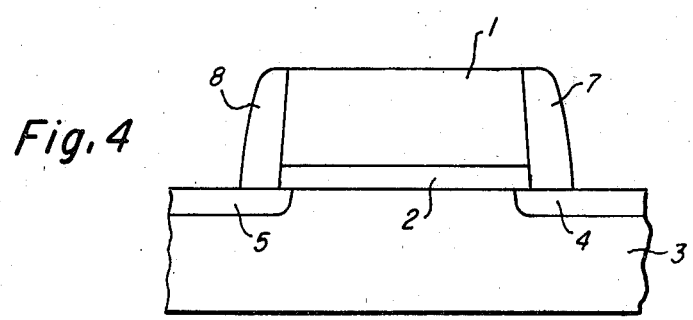
FIG. 4 is an enlarged sectional view illustrating the formation of the vertical layer adjacent to the gate.

FIG. 4 illustrates the formation of the vertical layers 7 and 8 adjacent to the conductor layer 1 and insulating layer 2 and also partially covering the regions of opposite polarity 5 and 4 and substrate 3. These vertical layers 7 and 8 are formed by a plasma etching of the silicon dioxide in a chlorocarbon mixture adjusted to be an anisotropic etch that etches in the vertical direction with a 4 to 1 etch ratio of silicon dioxide to silicon. Therefore, the etch will remove most of the silicon dioxide without substantial removal of the polysilicon conductor or silicon substrate. It should be understood by those skilled in the art that other sufficiently anisotropic etching methods, such as reactive ion etching, could be employed.

Figure 5:
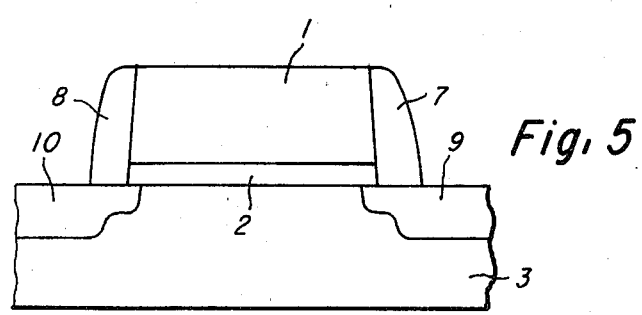
FIG. 5 is an enlarged sectional view illustrating the extension of the regions of opposite polarity.

FIG. 5 illustrates the extension of the regions of opposite polarity 9 and 10 into the substrate 3. These extensions are also formed by ion implantation which use the vertical layers 7 and 8 adjacent to the conductor layer 1 and insulating layer 2 as an ion implantation mask to avoid the ion implantation immediately beneath these vertical layers thus forming the profile of the regions of opposite polarity shown. This implanation would, in general, be at a higher energy and/or depth to provide a deeper extension of the oppositely doped contiguous region. It should also be obvious to one skilled in the art that the formation of the extension regions of opposite polarity may be accomplished by diffusion.

Figure 6:
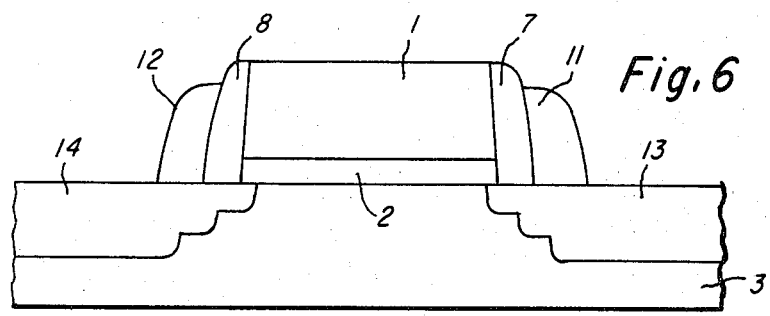
FIG. 6 is an enlarged sectional view illustrating the location of a second set of vertical layers and the further extension of the regions of opposite polarity.

FIG. 6 illustrates the continuation of this method to form a second set of vertical layers 11 and 12 adjacent to the vertical layers 7 and 8 which are in turn adjacent to the conductor layer 1 and insulating layer 2. These vertical layers allow an extension to the regions of opposite polarity to form the regions 13 and 14 in substrate 3. It should be evident to one skilled in the art that this method can be repeated to form additional contiguous extensions of these regions of opposite polarity into the substrate.

Figure 7:
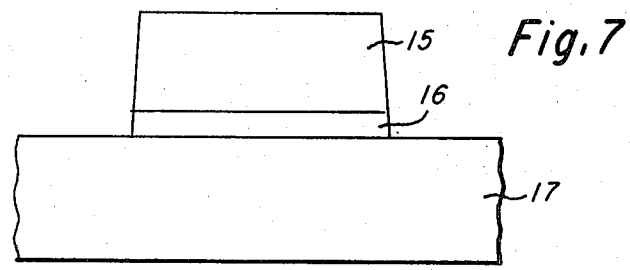
FIG. 7 is an enlarged sectional view illustrating a gate on top of an insulating layer on top of a substrate.

FIG. 7 illustrates the initial stages of a second embodiment of this invention. Specifically, FIG. 7 illustrates the conductor layer 15 on top of an insulating layer 16 which is in turn on top of a substrate 17. This conductor has a length of about one micron or less and is formed by a method previously described.

Figure 8:
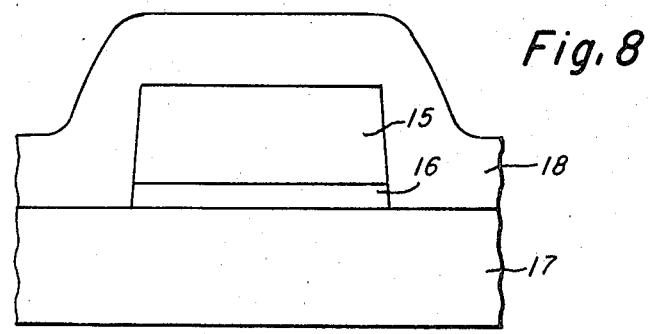
FIG. 8 is an enlarged sectional view illustrating a conformal layer deposited on top of the substrate and the conductor layer.

FIG. 8 illustrates the deposition of a conformal layer 18 on top of the conductor layer 15 and insulating layer 16 and substrate 17.

Figure 9:
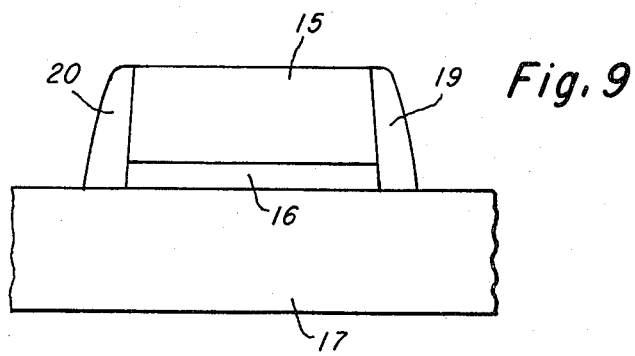
FIG. 9 is an enlarged sectional view illustrating the formation of first vertical layers adjacent to the conductor layer.

FIG. 9 illustrates the formation of the vertical layers 19 and 20 adjacent to the conductor layer, insulating layer 18 and on top of the substrate 17. The vertical layers would be formed by an anisotropic etching of the conformal layer as previously described.

Figure 10:
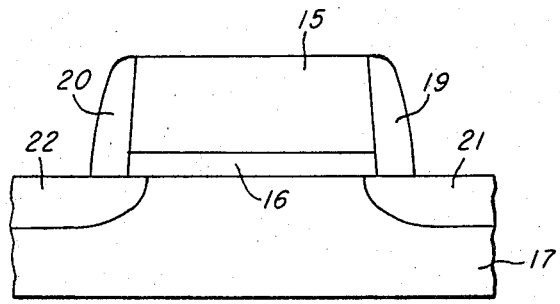
FIG. 10 is an enlarged sectional view illustrating the formation of regions of opposite polarity in the substrate.

FIG. 10 illustrate the partial formation of the regions of opposite polarity, 21 and 22, again using, e.g., ion implantation, in the substrate 17 adjacent to the vertical layers 19 and 20 which are in turn adjacent to the conductor layer 15 and insulating layers 16. The regions of opposite polarity are formed by ion implantation as previously described.

Figure 11:
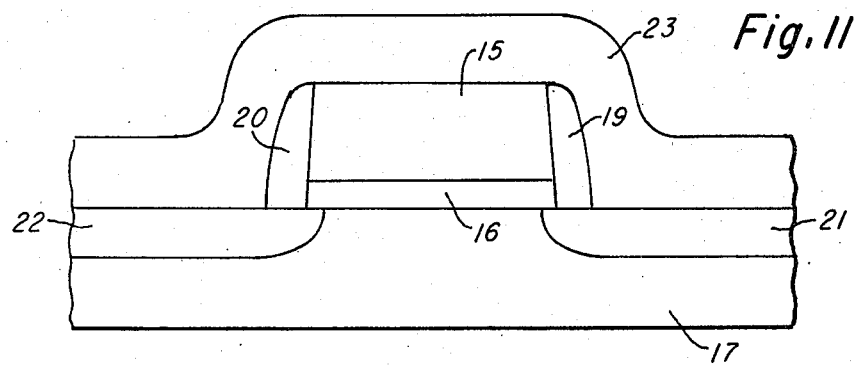
FIG. 11 is an enlarged sectional view illustrating a conformal layer deposited on top of the substrate, conductor layer, and first vertical layer.

FIG. 11 illustrates the deposition of a conformal layer 23 on top of the conductor layer 15, insulating layer 16, first vertical layers 19 and 20, and substrate 17.

Figure 12:
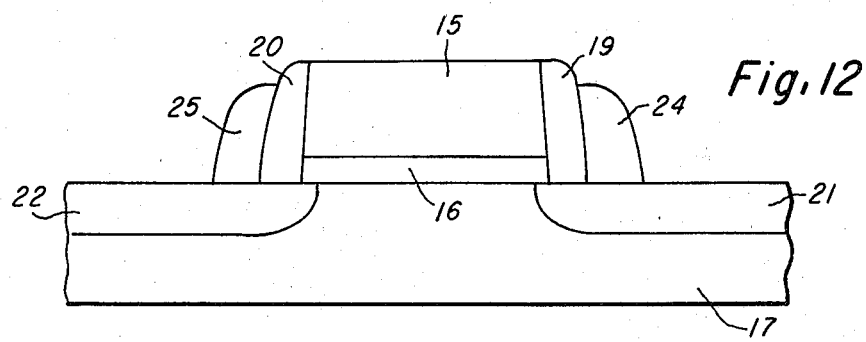
FIG. 12 is an enlarged sectional view illustrating the formation of second vertical layers adjacent to first vertical layers.

FIG. 12 illustrates the formation of a second vertical layers 24 and 25 which are adjacent to the first vertical layers 19 and 20 which are in turn adjacent to conductor 15, insulating layer 16 and this structure is located over the partially formed regions of opposite polarity 21 and 22 in substrate 17. The second vertical layers 24 and 25 are formed by an additional deposition of a conformal layer on top of and covering the substrate and conductor vertical layer structure followed by an anisotropically etching the second deposited conformal layer.

Figure 13:
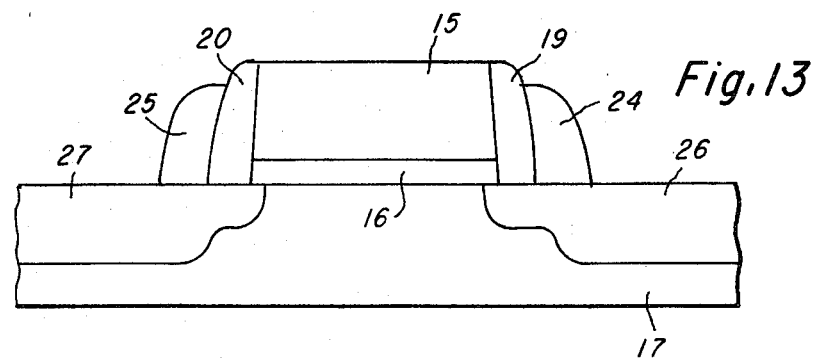
FIG. 13 is an enlarged sectional view illustrating the extension of the regions of opposite polarity into the substrate.

FIG. 13 illustrates the extension of the regions of opposite polarity 26 and 27 into the substrate 17. These extensions are formed by a second ion implantation which uses vertical layers 19,20,24, and 25 adjacent to the conductor layer 15 and insulating layer 16 as an ion implantation mask to avoid the ion implantation immediately beneath these vertical layers thus forming the profile of the regions of opposite polarity shown. This second implantation would, in general, be at a higher energy and or depth than the first ion implantation, to provide a deeper extension of the oppositely doped contiguous region.

Figure 14:
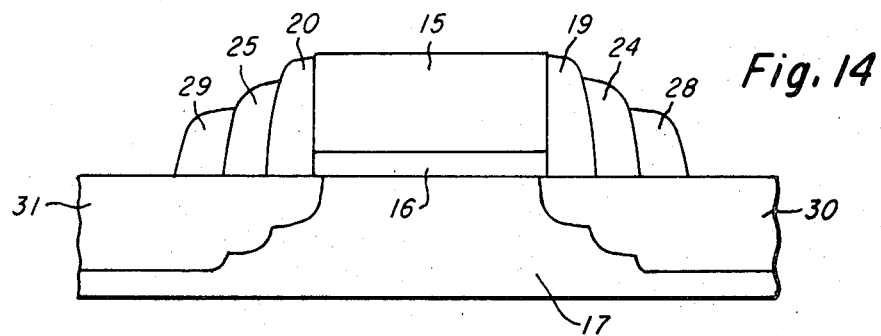
FIG. 14 is an enlarged sectional view illustrating the formation of third vertical layers adjacent to second vertical layers and the further extension of the regions of opposite polarity into the substrate.

FIG. 14 illustrates the formation of third vertical layers 28 and 29 adjacent to second vertical layers 24 and 25 and the further extension of the regions of opposite polarity 30 and 31 in substrate 17. The third vertical layers 28 and 29 are formed by an additional deposition of a conformal layer on top of and covering the substrate, conductor layer, and first and second vertical layers followed by anisotropically etching this third deposited conformal layer. The extensions are formed by a third ion implantation.

A preferred embodiment of the invention is now described. Referring to FIG. 1, the conductor layer 1 and insulating layer 2 are formed on the substrate 3 as previously described.

Referring now to FIG. 2, the implant 4 and 5 is preferably done using arsenic at a low energy and dose sufficient to give a doping level in the range of $10^{18}$ to $10^{20}$ cm$^{-3}$. An appropriate choice of energy and dose as might be used for channel length of 0.5 microns and below is 20 Kev and $2 \times 10^{14}$ cm$^{-2}$ respectively, which gives a junction depth of 750 angstroms, a sheet resistance of about 600 ohms per square, a surface concentration of $2 \times 10^{18}$ cm$^{-3}$ and a peak concentration to about $5 \times 10^{19}$ cm$^{-3}$. Another appropriate choice of energy and dose as might be appropriate for channel length in the range of 0.5 microns to 1.0 microns, is 30 Kev and $4 \times 10^{15}$ cm$^{-2}$ respectively, which gives a junction depth of 1200 angstroms, a sheet resistance of 120 ohms per square, surface concentrations of about $1 \times 10^{19}$ cm$^{-3}$ and peak concentrations of about $1 \times 10^{20}$ cm$^{-3}$.

Referring to FIG. 3, the conformal layer 6 is deposited on the substrate 3, the conductor layer 1 and the insulator 2 as previously described.

Referring now to FIG. 4, the vertical layers 7 and 8 are formed as previously described by the anisotropical etching of the conformal layer.

Figure 15:
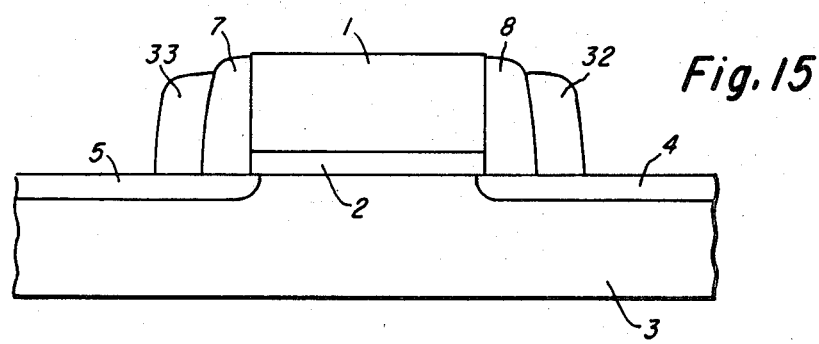
FIG. 15 is an enlarged sectional view illustrating the formation of first and second vertical layers adjacent to the conductor layer over partially formed regions of opposite polarity.

In the preferred embodiment, additional vertical layers are formed before a second ion implantation is made to adjust the profile of the regions of opposite polarity. FIG. 15 illustrates the formation of second vertical layers 32 and 33 adjacent to first vertical layers 7 and 8 which are in turn adjacent to conductor layer 1 and insulator layer 2. These second vertical layers are formed by first depositing a conformal layer on top of the substrate 3 including regions of opposite polarity 4 and 5, first vertical layers 7 and 8, and conductor layer 1 and then anisotropically etching the conformal layer to form the second vertical layers 32 and 33.

Figure 16:
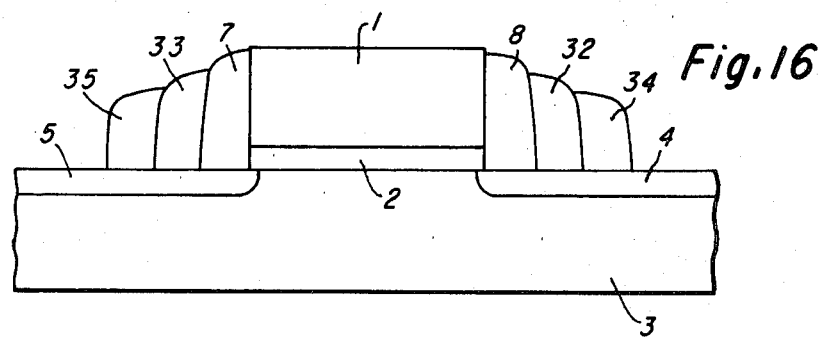
FIG. 16 is an enlarged sectional view illustrating the formation of third vertical layers adjacent to second vertical layers.

FIG. 16 illustrates the formation of a third set of vertical layers 34 and 35. This third set of vertical layers is formed in the same manner as the second set of vertical layers 32 and 33 as previously discussed. Using these etching process conditions, each vertical layer produced will be approximately 0.1 microns to 0.15 microns in width.

Figure 17:
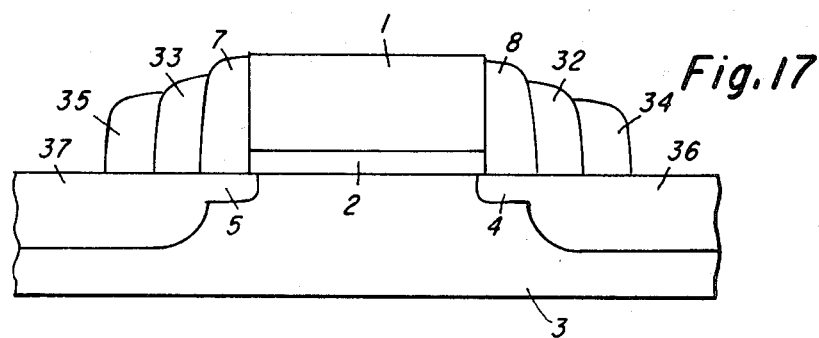
FIG. 17 is an enlarged sectional view illustrating the extension of the regions of opposite polarity into the substrate.

Referring now to FIG. 17 which illustrates the extension of the regions of opposite polarity 36 and 37, before the second implant, it is required to accumulate a total vertical layer width in excess of the desired lateral penetration of the second implant. Three such applications would result in a total width of approximately 0.3 microns to 0.45 microns. An etching process which is more anisotropic than the planar diode plasma etch described here, such as reactive ion etching, known to practioners of the art, could result in a total width in this range with only two (and possibly even one) formation of vertical layers. A second ion implant, shown in FIG. 17, could form a junction depth of about 0.35 microns, a sheet resistivity of about 20 to 30 ohms per square, and a concentration of about $2 \times 10^{20}$ cm$^{-3}$. The lateral spread of such a junction beyond the masking vertical layers is typically (0.7 to 0.8)×vertical junction depth. Such a junction can be achieved by using arsenic at 50 to 100 Kev and a dose from $5 \times 10^{15}$ to $1 \times 10^{16}$ cm$^{-2}$, or using phosphorus at 75 Kev and a dose of $3 \times 10^{15}$ cm$^{-2}$.

It can be seen by those skilled in the art that this invention has the following advantages:

1. In the immediate vicinity of the scaled device, the formation of very shallow regions of opposite polarity are possible which minimize short channel effects.

2. The series resistance of these shallow regions is not excessive, because it can be less than a lithographic dimension.

3. Because this shallow region can be more lightly doped (less than $10^{20}$ cm$^{-3}$) than normal, electric field lines at the high field drain end of the device can deplete this region, thereby causing an increase in the effective electrical boundary of this junction. This depletion phenomenon effectively reduces the field strength at the region of opposite polarity, thereby reducing parasitic effects, in particular impact ionization caused by hot carriers.

4. Because the overlap region of this very shallow diffusion with the conductor layer can be made very small, the overlap Miller capacitance can be proportionately reduced, resulting in improved performance.

5. Because the major portion of the junction of regions of opposite polarity is deeper and more heavily doped, resistive losses in these areas are less than if the shallow junction existed everywhere alone and carried all the current.

6. The deeper junction permits the making of reliable metal contacts without the complications normally associated with making reliable metal contacts to very shallow junctions.

7. The combination of offset, self-aligned shallow and deep junction permits implanted channel profiles which have a high concentration extending from the surface of the substrate inwards to a depth of at least as great as the shallower junction. Provided these profiles start to roll-off to a lower bulk background concentration at a depth shallower than the deeper junction, this implanted channel doping will not degrade the parasitic capacitance to substrate of the deeper junction which is determined almost entirely by the bulk doping of the starting substrate material. Thus the higher channel doping needed for control of short channel effects, particularly punchthrough, is possible with minimal impact on the parasitic capacitance of the junction.

8. All of the above mentioned attributes are possible with current processing technologies.

What is claimed is:

1. A method for fabricating a semiconductor device comprising the steps of:
    a. forming a conductor layer on the surface of a semiconductor substrate of one polarity between areas where regions of opposite polarity from said substrate are to be formed in said substrate,
    b. partially forming said regions of opposite polarity,
    c. forming vertical layers adjacent to said conductor layer,
    d. forming extensions of said regions of opposite polarity partially defined by said vertical layers, said extensions having the same polarity as said regions partially defined by said vertical layers, and
    e. forming contacts on said extensions.

2. A method according to claim 1, wherein said vertical layers are fabricated from an insulating material.

3. A method according to claim 1, wherein said vertical layers are located over said regions of opposite polarity.

4. A method according to claim 1, wherein said regions of opposite polarity are formed by diffusion.

5. A method according to claim 1, wherein said regions of opposite polarity are formed by ion implanation.

6. A method according to claim 1, wherein said extensions of said regions of opposite polarity are formed such that said vertical layers selectively mask a portion of said regions from doping, resulting in the formation of a greater doping concentration farther from said conductor layer.

7. A method for fabricating a semiconductor device comprising the steps of:
    a. forming a conductor layer on the surface of a semiconductor substrate of one polarity between areas where regions of opposite polarity from said substrate are to be formed in said substrate,
    b. forming first vertical layers adjacent to said conductor layer,
    c. partially forming said regions of opposite polarity,
    d. forming second vertical layers adjacent to said first vertical layers, e. forming extensions of said regions of opposite polarity, partially defined by said first and second vertical layer, said extensions having the same polarity as the regions partially defined by said vertical layers, and f. forming contacts on said extensions.

8. A method according to claim 7, wherein said partially formed regions of opposite polarity are formed adjacent to said first vertical layers.

9. A method according to claim 7, wherein said first and second vertical layers are formed from an insulating material.

10. A method according to claim 7, wherein said regions of opposite polarity are formed by diffusion.

11. A method according to claim 7, wherein said regions of opposite polarity are formed by ion implantation.

12. A method according to claim 7, wherein said extensions of said regions of opposite polarity are formed such that said vertical layers selectively mask a portion of said regions from doping resulting in the formation of a greater doping concentration farther from said conductor layer.

13. A method for fabricating a field effect device comprising the steps of:

a. forming the gate on the substrate between areas where the source and the drain regions are to be formed, b. partially forming the source and the drain regions, c. forming vertical layers adjacent to said gate, d. forming extensions to source and drain regions partially defined by said vertical layers, said extensions having the same polarity as said regions partially defined by said vertical layers, and e. forming contacts on said extensions.

14. A method according to claim 13, wherein said vertical layers are formed from an insulating material.

15. A method according to claim 13, wherein said vertical layers are formed over source and drain regions.

16. A method according to claim 13, wherein said extensions of regions of opposite polarity are formed such that said vertical layers selectively mask a portion of said regions from doping resulting in the formation of a greater doping concentration farther from said conductor layer.

17. A method according to claim 13, wherein said regions of opposite polarity are formed by diffusion.

18. A method according to claim 13, wherein said regions of opposite polarity are formed by ion implantation.

19. A method for fabricating a field effect device comprising the steps of:

a. forming the gate on the substrate between areas where the source and the drain regions are to be formed, b. forming first vertical layers adjacent to said gate, c. partially forming the source and the drain regions, d. forming second vertical layers adjacent to said first vertical layers, e. forming extensions to source and drain regions partially defined by said first and second vertical layers, said extensions having the same polarity as the regions partially defined by said first and second vertical layers, and f. forming contacts on said extensions.

20. A method according to claim 19, wherein said first and second vertical layers are fabricated from an insulating material.

21. A method according to claim 19, wherein said source and drain regions are formed by diffusion.

22. A method according to claim 19, wherein said source and drain regions are formed by ion implantation.

23. A method according to claim 19, wherein said source and drain regions are formed such that said first and second vertical layers selectively mask a portion of said source and drain regions from doping resulting in the formation of greater doping concentrations farther from said gate.

24. A method for fabricating a field effect device comprising the steps of:

a. forming the gate on the substrate between areas where the source and the drain regions are to be formed b. partially forming said source and drain regions by ion implantation, c. depositing a conformal layer on top of said gate, d. anisotropically etching the said conformal layer, and, e. forming extensions to the source and drain by second ion implantation.

25. A method for fabricating a field effect device comprising the steps of:

a. forming the gate on the substrate to define areas where the source and drain regions are to be formed, b. depositing first conformal layer on top of said gate, c. anisotropically etching the first conformal layer, d. partially forming said source and drain regions by ion implantation, e. depositing second conformal layer on top of said gate and remaining first conformal layer, f. anisotropically etching said second conformal layer, and g. forming extensions to source and drain regions by second ion implantation.

* * * * *

REEXAMINATION CERTIFICATE (1102nd)

United States Patent [19]

Hunter

[11] B1 4,356,623

[45] Certificate Issued Jul. 25, 1989

[54] FABRICATION OF SUBMICRON SEMICONDUTOR DEVICES

[75] Inventor: William R. Hunter, Garland, Tex.

[73] Assignee: Texas Instruments Incorporated

Reexamination Request:
No. 90/001,516, May 25, 1988

Reexamination Certificate for:
Patent No.: 4,356,623
Issued: Nov. 2, 1982
Appl. No.: 187,642
Filed: Sep. 15, 1980

[51] Int. Cl.$^4$ .................. H01L 21/22; H01L 21/26
[52] U.S. Cl. ............................... 437/44; 437/27; 437/41; 437/192; 437/200; 437/958; 156/643; 357/23.9; 357/54; 357/23.3
[58] Field of Search ............... 437/41, 44, 233, 186, 437/187, 189, 192, 193, 196, 200, 201, 202, 235, 238, 241, 245; 357/23.3, 23.9, 91, 59 G

[56] References Cited

U.S. PATENT DOCUMENTS

| | | | |
|---|---|---|---|
| 3,986,903 | 10/1976 | Watrous, Jr. | 437/41 |
| 3,996,657 | 12/1976 | Simko et al. | 437/44 |
| 4,074,300 | 2/1978 | Sakai et al. | 357/23 |
| 4,109,371 | 8/1978 | Shibata et al. | 437/44 |
| 4,114,256 | 9/1978 | Thibault et al. | 437/41 |
| 4,234,362 | 11/1980 | Riseman | 437/158 |
| 4,356,040 | 10/1982 | Fu et al. | 437/49 |

FOREIGN PATENT DOCUMENTS 44482 4/1979 Japan.

OTHER PUBLICATIONS

E. Bassous, et al; Self-Aligned Polysilicon gate MOSFETs with Tailored Source and Drain Profiles; IBM Tech. Disclosure Bulletin, vol. 22, No. 11, Apr. 1980, p. 5146.

Wolf et al., Silicon Processing for the VLSI Era, vol. 1: Process Technology, Lattice Press, Sunset Beach, CA, pp. 521–523, 1986.

The American Heritage Dictionary, Second College Edition, Houghton Mifflin Co., Boston, MA, 1982, p. 1344.

*Primary Examiner*—Brian E. Hearn
*Assistant Examiner*—Mary A. Wilczewski

[57] ABSTRACT

A method for fabricating a semiconductor device of relatively small scale. A conductivity layer is deposited on a substrate of a polarity. Regions of opposite polarity are partially formed on either side of the conductor layer. Vertical layers are formed to partially cover the regions of opposite polarity and are located adjacent to the conductor layer. Extensions of the regions of opposite polarity are formed such that a portion of the extension is defined by the location of the vertical layers.

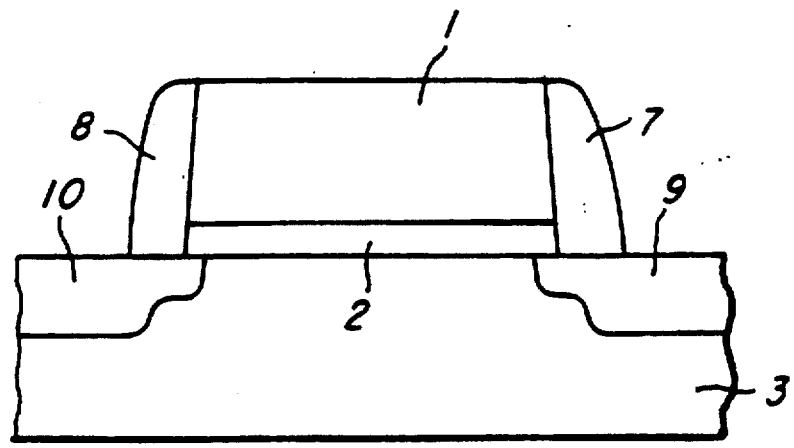

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–6, 13–18 and 24 are cancelled.

Claims 7, 19 and 25 are determined to be patentable as amended.

Claims 8–12 and 20–23, dependent on an amended claim, are determined to be patentable.

New claim 26 is added and determined to be patentable.

7. A method for fabricating a semiconductor device comprising the steps of:
  a. forming a conductor layer on the surface of a semiconductor substrate of one polarity between areas where regions of opposite polarity from said substrate are to be formed in said substrate,
  b. forming first vertical layers adjacent to said conductor layer,
  c. partially forming said regions of opposite polarity,
  d. forming second vertical layers adjacent to said first vertical layers,
  e. forming extensions of said regions of opposite polarity, partially defined by said first and second vertical layer, said extensions having the same polarity as the regions partially defined by said vertical layers, and
  f. forming contacts on said extensions [.],
  *g. wherein step b. precedes step c. and step c. precedes step d.*

19. A method for fabricating a field effect device comprising the steps of:
  a. forming the gate on the substrate between areas where the source and the drain regions are to be formed,
  b. forming first vertical layers adjacent to said gate,
  c. partially forming the source and drain regions,
  d. forming second vertical layers adjacent to said first vertical layers,
  e. forming extensions to source and drain regions partially defined by said first and second vertical layers, said extensions having the same polarity as said regions partially defined by said first and second vertical layers, and
  f. forming contacts on said extensions [.],
  *g. wherein step b. precedes step c., and step c. precedes step d.*

25. A method for fabricating a field effect device comprising the steps of:
  a. forming the gate on the substrate to define areas where the source and drain regions are to be formed,
  b. depositing first conformal layer on top of said gate,
  c. anisotropically etching the first conformal layer,
  d. partially forming said source and drain regions by ion implantation,
  e. depositing second conformal layer on top of said gate and remaining first conformal layer,
  f. anisotropically etching said second conformal layer, and
  g. forming extensions to source and drain regions by second ion implantation [.],
  *h. wherein step b. precedes step d.*

*26. A method for fabricating a field effect device comprising the steps of:*
  *forming the gate on the substrate between areas where the source and the drain regions are to be formed,*
  *b. partially forming the source and drain regions,*
  *c. forming first vertical layers adjacent to said gate,*
  *d. forming second vertical layers adjacent to said first vertical layers,*
  *e. forming extensions to source and drain regions partially defined by said first and second vertical layers, said extensions having the same polarity as said regions partially defined by said first and second vertical layers, and*
  *f. forming contacts on said extensions,*
  *g. wherein step b. precedes step c., step c. precedes step d., step d. precedes step e., and said forming said first vertical layer includes anisotropic etching a conformal layer.*

* * * * *